United States Patent
Lile

(10) Patent No.: US 6,307,182 B1
(45) Date of Patent: *Oct. 23, 2001

(54) ELECTRIC APPLIANCE HAVING A PROXIMITY SENSOR

(75) Inventor: Lawrence O. Lile, Columbia, MO (US)

(73) Assignee: Toastmaster, Inc., Columbia, MO (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/845,702

(22) Filed: Apr. 25, 1997

(51) Int. Cl.[7] ...................................................... D06F 75/26
(52) U.S. Cl. .......................... 219/257; 219/251; 307/116; 340/635
(58) Field of Search ..................................... 219/257, 240, 219/518, 509, 251, 506, 241; 200/600; 307/116, 125, 652, 117, 326; 324/679, 686, 677, 678; 38/74, 82, 90; 15/319; 235/462.32

(56) References Cited

U.S. PATENT DOCUMENTS

| Re. 33,285 | 7/1990 | Kunen . |
| D. 362,944 | 10/1995 | Sham et al. . |
| D. 373,872 | 9/1996 | Sham . |
| 3,666,988 | 5/1972 | Bellis . |
| 4,029,996 | 6/1977 | Miffitt . |
| 4,130,955 | 12/1978 | Baumgartner et al. . |
| 4,157,539 | * 6/1979 | Hunts et al. ............................ 341/33 |
| 4,203,101 | 5/1980 | Towsend . |
| 4,536,641 | 8/1985 | Chan . |
| 4,580,038 | * 4/1986 | O'Loughlin ........................... 219/506 |
| 4,668,877 | 5/1987 | Kunen . |
| 4,673,798 | 6/1987 | Contri et al. . |
| 4,686,352 | 8/1987 | Nawrot et al. . |

(List continued on next page.)

FOREIGN PATENT DOCUMENTS

| 42 36 537 | 4/1994 | (DE) . |
| 43 16 141 | 5/1994 | (DE) . |
| 645 870 | 3/1995 | (EP) . |
| 723339 | * 7/1996 | (EP) . |
| 2 078 511 | 1/1982 | (GB) . |
| 2 097 254 | 11/1982 | (GB) . |
| 2 214 369 | 8/1989 | (GB) . |
| 2266397 | * 10/1993 | (GB) . |
| 2 267 151 | 11/1993 | (GB) . |
| 63-142917 | * 6/1988 | (JP) . |
| 5-90936 | * 4/1993 | (JP) . |
| 82/0352 | 10/1982 | (WO) . |
| 96/34510 | 10/1996 | (WO) . |

OTHER PUBLICATIONS

Philips Style Control Auto Sensor 1200 (HP 4386/Fl).

*Primary Examiner*—Teresa Walberg
*Assistant Examiner*—Quang Van
(74) *Attorney, Agent, or Firm*—Sonnenschein Nath & Rosenthal

(57) ABSTRACT

An electric iron having a microprocessor-controlled relay which automatically connects an iron to and disconnects an iron from a source of electrical power based upon whether a user is grasping the handle of the iron and the position of the iron. The microprocessor is coupled to a proximity sensor comprised of a conductive sheet disposed within the iron handle, as well as a conventional orientation sensor. To determine whether a user is grasping the iron handle, the microprocessor detects the amount of time required to charge the proximity sensor to a predetermined voltage level, and compares the charge time to predetermined setpoints. The charge time will be greater than the setpoints when a user is grasping the iron handle due to the effective capacitance created by the conductive sheet, the iron handle, and the user's hand. To determine the position of the iron, the microprocessor detects whether the orientation sensor circuit is open or closed.

29 Claims, 5 Drawing Sheets

U.S. PATENT DOCUMENTS

| | | | |
|---|---|---|---|
| 4,692,589 | * | 9/1987 | Borsari et al. .................. 219/251 |
| 4,701,676 | | 10/1987 | Gibson . |
| 4,745,260 | | 5/1988 | Albinger, Jr. et al. . |
| 4,822,979 | * | 4/1989 | DeKam .................. 219/241 |
| 4,859,869 | * | 8/1989 | Heuwinkel et al. .................. 307/117 |
| 5,021,740 | * | 6/1991 | Sarr et al. .................. 324/687 |
| 5,042,179 | | 8/1991 | van der Meer . |
| 5,187,356 | * | 2/1993 | Chadima, Jr. et al. ......... 235/462.32 |
| 5,245,295 | * | 9/1993 | Hata et al. .................. 324/683 |
| 5,353,468 | * | 10/1994 | Yap et al. .................. 15/319 |
| 5,380,983 | | 1/1995 | Cavada et al. . |
| 5,453,644 | * | 9/1995 | Yap et al. .................. 307/116 |
| 5,463,205 | | 10/1995 | Sham et al. . |
| 5,508,700 | * | 4/1996 | Taylor et al. .................. 200/600 |
| 5,554,973 | * | 9/1996 | Kawashima et al. .................. 307/125 |
| 5,583,386 | * | 12/1996 | Meixner et al. .................. 307/326 |
| 5,595,672 | | 1/1997 | Sham et al. . |
| 5,780,812 | * | 7/1998 | Klinkenberh .................. 219/251 |

* cited by examiner

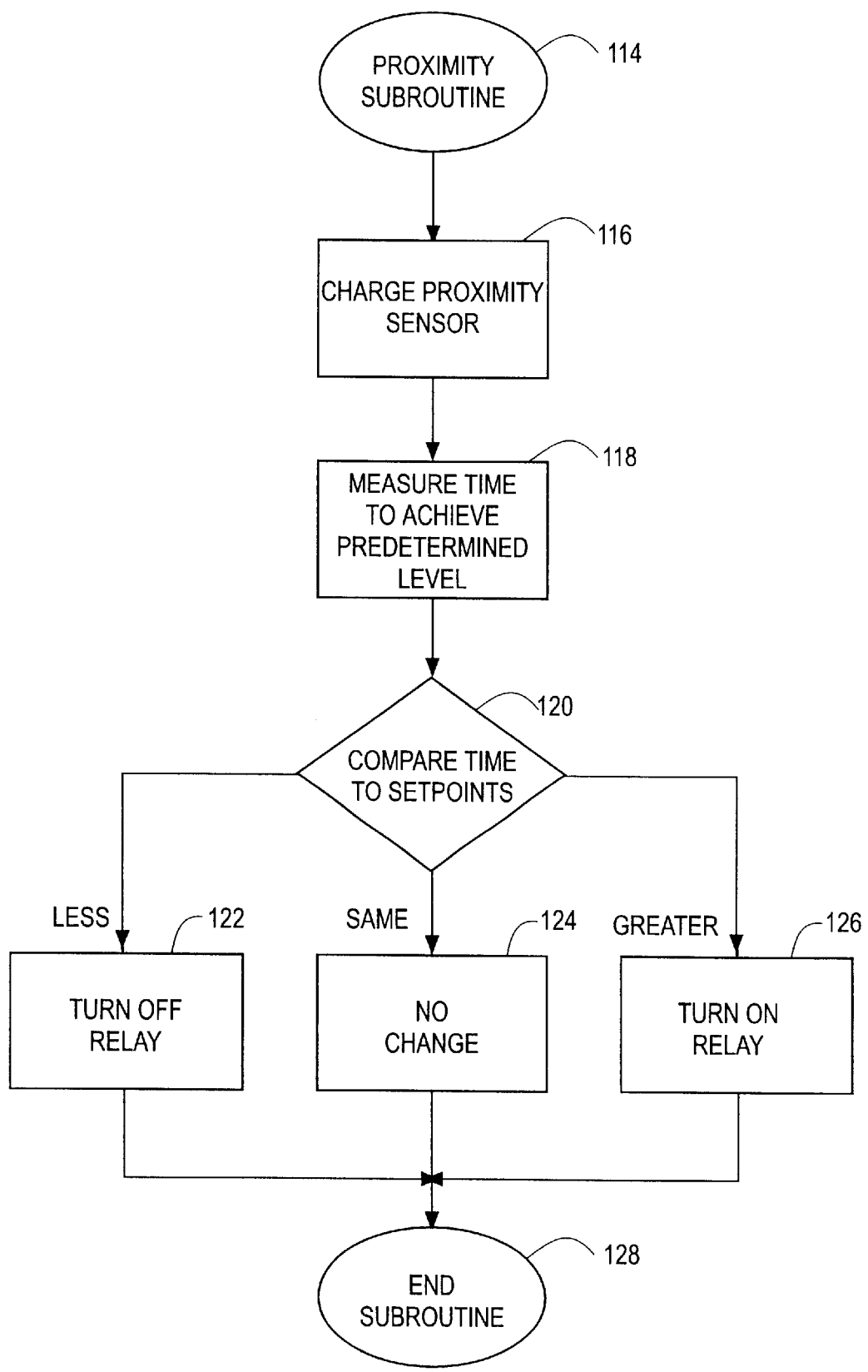

ELECTRIC APPLIANCE HAVING A PROXIMITY SENSOR

FIELD OF THE INVENTION

The present invention relates generally to electric appliances having an automatic power interrupting device and, in particular, to electric appliances having a proximity sensor to detect use and non-use of the appliance.

BACKGROUND OF THE INVENTION

Conventional electric pressing irons have been used for many years to press articles of clothing and various textiles. Such irons include a soleplate having a heating element connected to a source of electrical power which heats the soleplate to a sufficient temperature to press the articles of clothing.

A number of problems exist with conventional electric pressing irons, however, in that the iron is prone to scorch clothing, cause fires, or cause burns to a person who inadvertently contacts the heated soleplate of the iron. For example, when the attention of a user of the iron is directed away from the iron, the heated soleplate may be left in a horizontal position and in direct contact with an article of clothing. As such, the article of clothing may be scorched by the iron, or, more seriously, the heated soleplate may cause the article of clothing to ignite into flames, potentially creating a fire in the household. Moreover, when an iron is left unattended in a vertical position, a person, commonly a child, may contact the heated soleplate of the iron, typically causing severe burns to the person. Thus, a need has existed to provide an automatic power interrupting device which disconnects the heating element from the source of electrical power upon the detection of non-use of the iron. One attempt to address the above-noted problem has been to provide motion sensitive switches which disconnect the heating element from the source of electrical power when no movement of the iron is detected. A disadvantage exists, however, in that vibrations caused by sources other than a user of the iron, such as nearby machinery or human activity, may cause motion sensitive switches to detect movement, thus resulting in an unattended iron being heated.

Another attempt to address the above-noted problem has been to provide touch sensitive switches which disconnect the heating element from the source of electrical power when no direct contact is detected between the hand of a user and a conductive sensor on the handle of the iron. A disadvantage exists, however, in that if there is not sufficient isolation between the conductive sensor and the source of electrical power, there is a potential for a dangerous shock to the user who is in direct electrical contact with the conductive sensor.

Another attempt to address the above-noted problem has been to provide user proximity switches which employ a proximity sensor located within the handle of the iron to detect AC power line frequencies picked up by the body of a user and capacitively coupled from the hand of the user to the proximity sensor. Such switches disconnect the heating element from the source of electrical power when no AC power line frequencies are detected. A disadvantage exists, however, in that objects other than the hand of a user placed near the handle of the iron may pick up AC power line frequencies and couple them to the proximity sensor, thus resulting in an unattended iron being heated. In addition to the above-noted disadvantages, a further problem exists in that the automatic power interrupting devices of such electric pressing irons do not automatically reconnect the heating element to the source of electrical power upon the detection of use of the iron. As such, the user must manually reconnect the heating element to the source of electrical power after a period of non-use of the iron, such as by turning the iron off and back on again, or by depressing a manual reset switch.

SUMMARY OF THE INVENTION

Therefore, it is an object of the present invention to provide an electric appliance, such as a pressing iron, which detects non-use of the appliance without relying on the detection of movement of the appliance.

It is another object of the present invention to provide an electric appliance, such as a pressing iron, which detects non-use of the appliance without relying on the detection of direct contact between the body of a user and a conductive sensor located on an outside surface of the appliance.

It is another object of the present invention to provide an electric appliance, such as a pressing iron, which detects non-use of the appliance without relying on the detection of AC power line frequencies capacitively coupled from the body of a user to a proximity sensor located within the appliance.

It is a further object of the present invention to provide an electric appliance, such as a pressing iron, which automatically connects the appliance to the source of electrical power upon the detection of use of the appliance.

In a preferred embodiment, an electric pressing iron according to the present invention includes a soleplate having a heating element operatively connected to a source of electrical power which heats the soleplate to a desired temperature.

The iron also includes a power control circuit having a user proximity circuit for detecting the proximity of the hand of a user to the handle of the iron, a conventional orientation circuit for detecting the position of the iron, and a switching circuit controlled by the user proximity circuit and the orientation circuit for automatically connecting and disconnecting the heating element to and from the source of electrical power.

The user proximity circuit of the power control circuit includes a proximity sensor, a signal generator for periodically charging the proximity sensor to a predetermined voltage level, and a signal detector for determining the amount of time required to charge the proximity sensor to such predetermined voltage level, the amount of time being directly related to the capacitance of the proximity sensor. The proximity sensor consists of a conductive sheet located within the handle of the iron, such that when the hand of a user is in proximity to the handle of the iron, the conductive sheet functions as the first plate of a capacitor, the user functions as the second plate of the capacitor, and the handle of the iron functions as the dielectric of the capacitor. Thus, when the hand of a user is in proximity to the handle of the iron, the capacitance of the proximity sensor is increased and the amount of time required to charge the proximity sensor to the predetermined voltage level is increased, thereby allowing the user proximity circuit to detect that the hand of the user is in proximity to the handle of the iron. Conversely, when the hand of a user is not in proximity to the handle of the iron, the capacitance of the proximity sensor is decreased and the amount of time required to charge the proximity sensor to the predetermined voltage level is decreased, thereby allowing the user proximity circuit to detect that the hand of the user is not in proximity to the handle of the iron. As such, the electric pressing iron in the preferred embodiment detects non-use, as well as use, of the iron by detecting the capacitance of the proximity sensor.

As is known in the art, the conventional orientation circuit of the power control circuit detects whether the iron is in a substantially horizontal position or a substantially vertical position.

As previously stated, the switching circuit of the power control circuit is controlled by the user proximity circuit and the conventional orientation circuit. In use, when the hand of a user is in proximity to the handle of the iron and the iron is in a horizontal position, the switching circuit automatically connects the heating element to the source of electrical power. When the user's hand is not in proximity to the handle of the iron and the iron is in a horizontal position, the switching circuit automatically disconnects the heating element from the source of electrical power. When the iron is in a vertical position, the switching circuit automatically disconnects the heating element from the source of electrical power after a predetermined amount of time. As such, the electric pressing iron in the preferred embodiment automatically connects the heating element to the source of electrical power upon the detection of use of the iron.

BRIEF DESCRIPTION OF THE DRAWINGS

FIG. 7 is a logic flow diagram of the proximity subroutine of the logic flow diagram of FIG. 6.

DETAILED DESCRIPTION OF THE PREFERRED EMBODIMENT

Reference will now be made in detail to the preferred embodiment of the present invention, an example of which is illustrated in the accompanying drawings.

Figure 1:
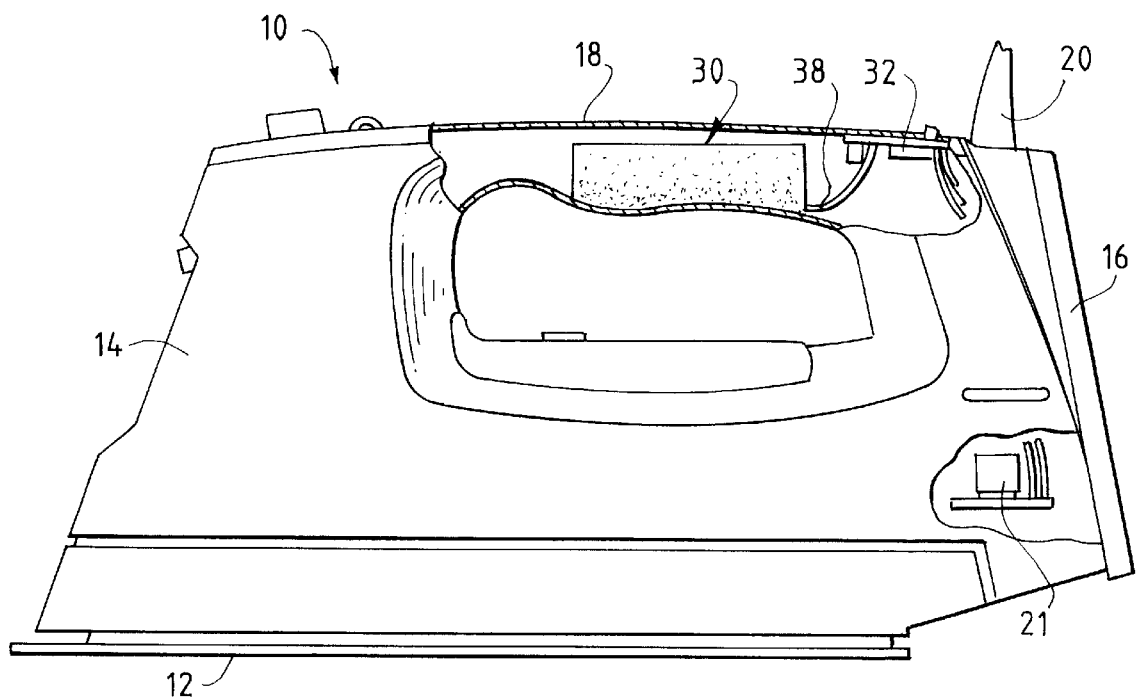
FIG. 1 is a side elevational view of an electric pressing iron according to the present invention, with a portion of the handle cut away to show the power control circuit board and proximity sensor.
Figure 2:
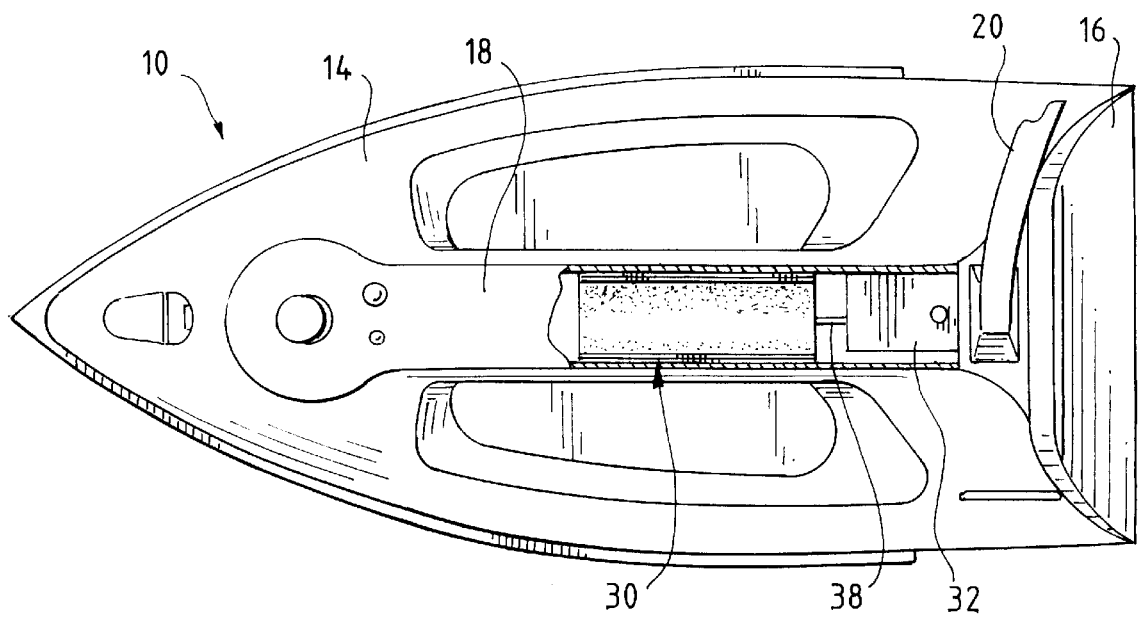
FIG. 2 is a top plan view of the electric pressing iron of FIG. 1.

FIGS. 1–4 illustrate a preferred embodiment of the electric appliance and proximity sensor according to the present invention. Referring to FIGS. 1 and 2, an electric pressing iron is designated generally as numeral 10. The pressing iron 10 includes a soleplate 12, typically of cast aluminum, onto which is mounted a housing 14, typically of molded plastic. The housing 14 includes a heel portion 16 adapted to enable the iron 10 to be positioned in a substantially vertically oriented position, and a handle portion 18 adapted to be held by a user of the iron 10. Extending from the top of the heel portion 16 and the rear of the handle portion 18 is an electrical line cord 20 for connecting the iron 10 to a conventional AC power source. A power board 21 is also disposed within the body of the housing 14. A heating element, typically consisting of a calrod-type resistance wire heater, is mounted within the soleplate 12 and is operatively connected to the electrical line cord 20 for heating the soleplate 12 to a temperature suitable to press an article of clothing or various textiles. A number of user controls (not shown), including a temperature selector knob, a steam actuator, and a steam control button, may be provided on the housing 14 for controlling such conventional functions as are well known in the art.

Figure 3:
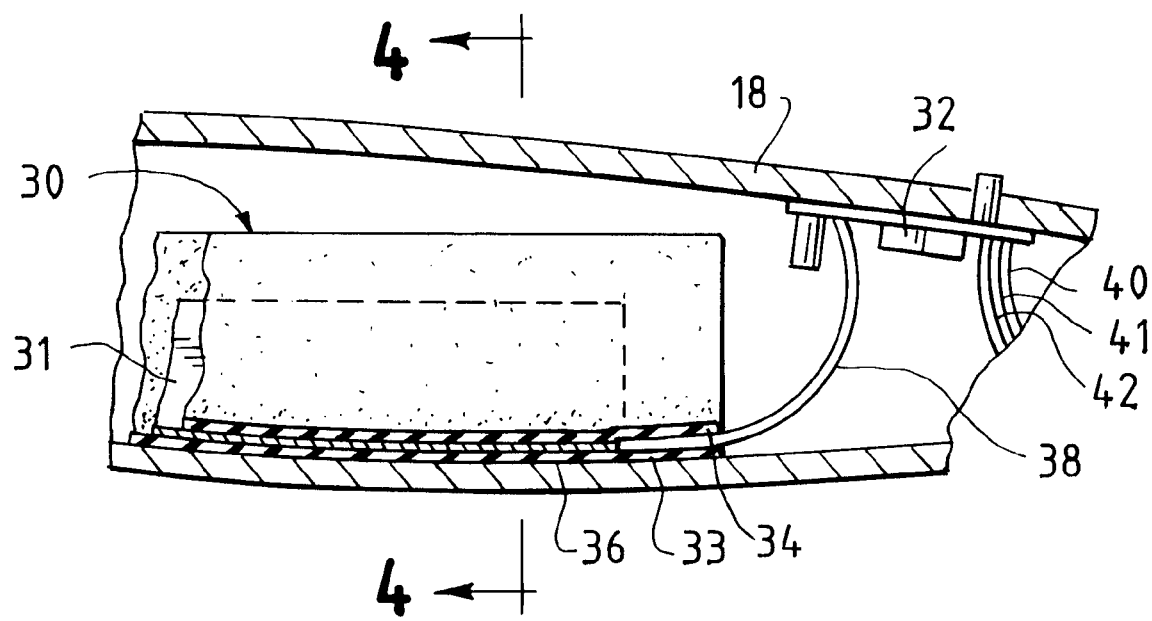
FIG. 3 is a side elevational cross section view of a portion of the handle of FIGS. 1 and 2.
Figure 4:
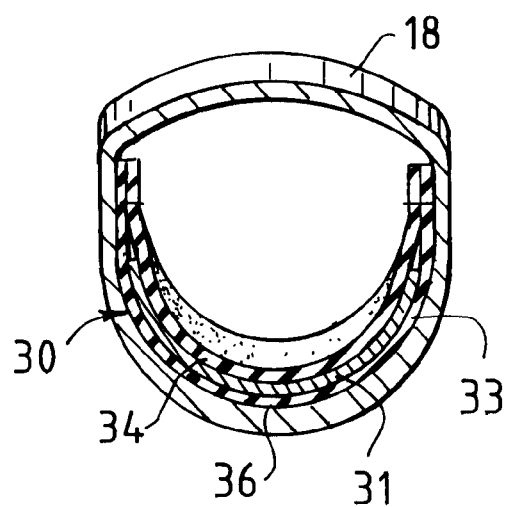
FIG. 4 is a cross section view taken across section line 4—4 of FIG. 3.

Referring to FIGS. 3 and 4, the handle 18 of the iron 10 is shown in greater detail. As shown, a conductive plate 30 and a power control circuit board 32 are disposed within the handle 18 of the iron 10.

The pliable sheet 30 consists of a thin conductive sheet 31, such as copper or aluminum, interposed between two thin sheets of an insuative dielectric material 33 and 34, such as Mylar. The conductive plate 30 is sufficiently pliable so as to be substantially conformed to the inner surface 36 of the handle 18, and is positioned within the handle 18 such that the handle 18 is located between the sheet 30 and the hand of a user of the iron 10 when the user is gripping the handle 18 of the iron 10. As such, the conductive sheet 31 functions as the first plate of a capacitor, the user's hand functions as the second plate of the capacitor, and the handle 18 functions as the dielectric of the capacitor.

It should be noted that the conductive sheet 31 interposed between the two thin sheets of insulative dielectric material 33 and 34 could also be positioned on the outside of the handle 18 such that the outer sheet of insulative dielectric material 32 is located between the conductive sheet 31 and the hand of a user of the iron 10 when the user is gripping the handle 18 of the iron 10. As such, the conductive sheet 31 functions as the first plate of a capacitor, the user's hand functions as the second plate of the capacitor, and the outer sheet of insulative dielectric material 33 functions as the dielectric of the capacitor.

An electrical lead 38 electrically connects the conductive sheet 31 to the power control circuit board 32 disposed within the handle 18 of the iron 10. Electrical leads 40, 41, and 42 electrically connect the power control circuit board 32 and the power board 21 to the electrical line cord 20, and thus to the AC power source, as well as to the heating element mounted within the soleplate 12 of the iron 10. As such, the heating element can be automatically connected and disconnected to and from the AC power source as controlled by the power board 21 and a power control circuit located on the power control circuit board 32, which will be discussed hereinbelow.

Figure 5:
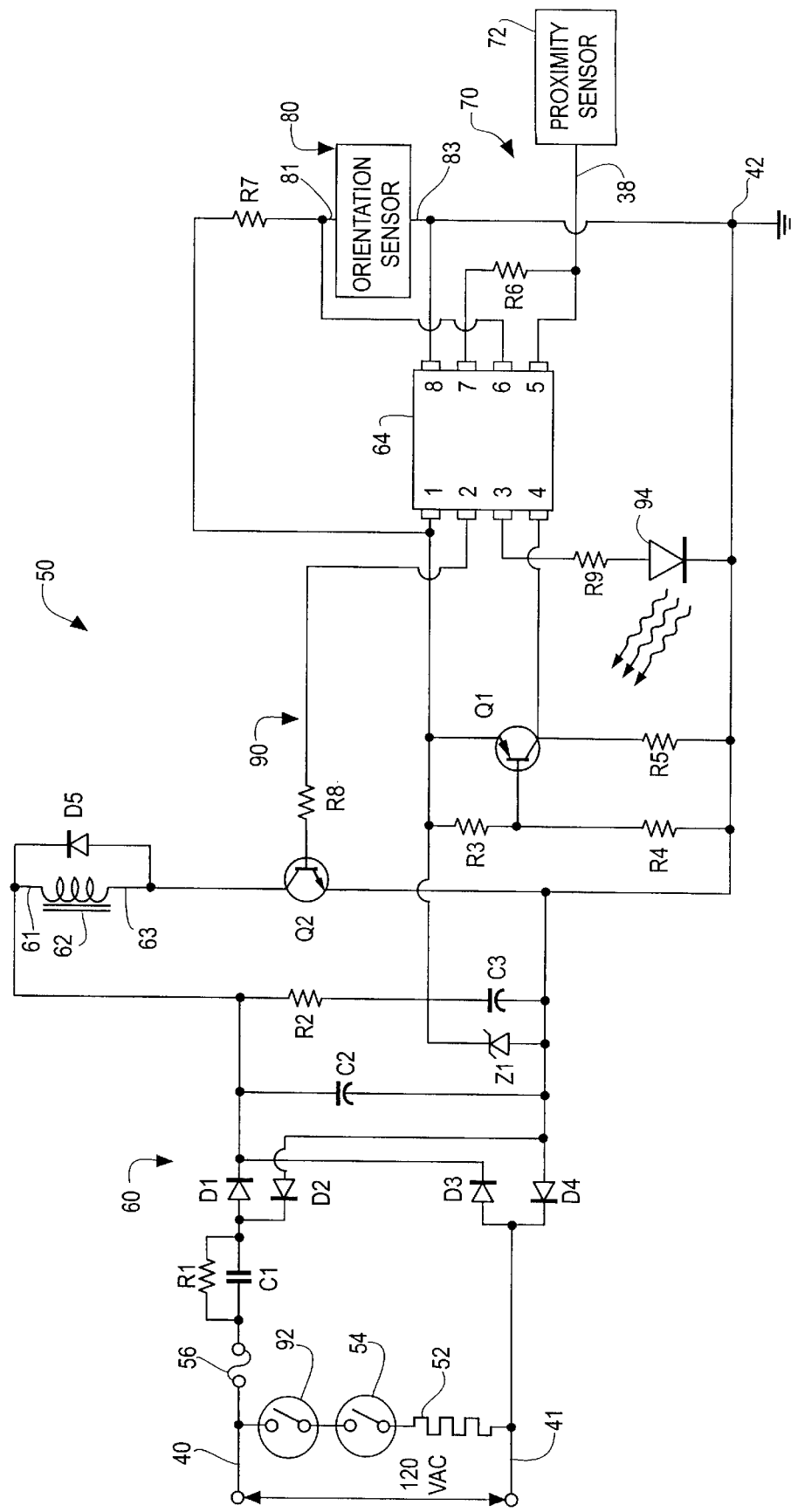
FIG. 5 is an electrical schematic diagram of the power control circuit and proximity sensor of FIGS. 1–4.

Referring to FIG. 5, the power control circuit according to the present invention is designated generally as numeral 50. A heating element 52, a thermostatic control 54, and a fuse 56 operate in the conventional manner. The power control circuit 50 may be described as a plurality of sub-circuits, which include a power supply circuit 60, a user proximity circuit 70, an orientation circuit 80, and a switching circuit 90.

Power Supply Circuit

The power supply circuit 60 of the power control circuit 50 supplies power to all of the components. Electrical leads 40 and 41 electrically connect the power control circuit 50 to the electrical line cord 20, and thus to a conventional 120 VAC power source. Although other circuit designs are possible, a 0.68 microfarad capacitor C1 is connected to electrical lead 40 and functions to step down the line voltage of the AC power source to approximately 24 VAC. A 100K ohm bleeding resistor R1 is connected in parallel with capacitor C1 and functions to provide a discharge path for capacitor C1 when electrical leads 40 and 41 are disconnected from the AC power source.

A conventional diode bridge rectifier consisting of diodes D1, D2, D3, and D4 is connected to capacitor C1 in the conventional manner. The diode bridge rectifier functions to rectify the line voltage of the AC power source to approximately 24 VDC.

A 22 microfarad capacitor C2 is connected to the diode bridge rectifier and to ground, and the junction of the diode bridge rectifier and capacitor C2 is connected to terminal 61 of relay 62. Capacitor C2 functions to integrate the voltage from the diode bridge rectifier to produce 24 VDC suitable for operating relay 62.

A 4.7K ohm dropping resistor R2 is connected in parallel to the diode bridge rectifier, a zener diode Z1 and a 22 microfarad capacitor C3 are connected in parallel to ground, and the junction of resistor R2, zener diode Z1 and capacitor C3 is connected to POWER pin 1 of a microcontroller 64. These components function to reduce and regulate the DC voltage from the diode bridge rectifier to approximately 5 VDC, suitable for operating the microcontroller 64 and other components. Although other microcontrollers may be used, the microcontroller in the preferred embodiment is Part No. PIC12C508/4 manufactured by Microchip.

A 10K ohm resistor R3 is connected between POWER pin 1 of the microcontroller 64 and the base of a pnp transistor Q1. A 51K ohm resistor R4 is connected between the base of transistor Q1 and ground. The emitter of transistor Q1 is connected to POWER pin 1 of the microcontroller 64. The collector of transistor Q1 is connected to RESET pin 4 of the microcontroller 64, and through a 10K ohm resistor R5 to ground. Resistors R3, R4, and R5, and transistor Q1 keep the microcontroller 64 in reset during the period when the power to the microcontroller 64 has not reached 5 VDC.

User Proximity Circuit

The user proximity circuit 70 of the power control circuit 50 detects the proximity of a user of the iron 10 to the handle 18 of the iron 10.

Although other circuit designs are possible, the user proximity circuit 70 in the preferred embodiment includes OUTPUT pin 7 of the microcontroller 64 connected through a 1.2M ohm resistor R6 to a proximity sensor 72. The proximity sensor 72 consists of the conductive plate 30 disposed within the handle 18 of the iron 10 (see FIGS. 1–4). The junction of resistor R6 and the proximity sensor 72 is connected to INPUT pin 5 of the microcontroller 64.

During a measurement cycle, the microcontroller 64 pulses OUTPUT pin 7 and places 5 VDC on resistor R6, thereby charging the proximity sensor 72 through electrical lead 38. The microcontroller 64 simultaneously senses the voltage level of the pulse through INPUT pin 5. The operation of the user proximity circuit 70 will be described in more detail below.

Orientation Circuit

The orientation circuit 80 of the power control circuit 50 detects the position of the iron 10.

Although other circuit designs are possible, the orientation circuit 80 in the preferred embodiment includes POWER pin 1 of the microcontroller 64 connected through a 10K ohm resistor R7 to INPUT pin 6 of the microcontroller 64. The junction of resistor R7 and INPUT pin 6 is connected to the first terminal 81 of a conventional orientation sensor 82, such as a mercury switch commonly known in the art. The second terminal 83 of the orientation sensor 82 is connected to ground.

The orientation sensor 82 is arranged such that when the iron 10 is placed on its heel portion 16 in a substantially vertical position, the orientation sensor 82 is open, and INPUT pin 6 of the microcontroller 64 senses 5 VDC (high). When the iron 10 is placed on its soleplate 12 in a substantially horizontal position, the orientation sensor 82 is closed, and INPUT pin 6 of the microcontroller 64 senses no voltage (low).

Switching Circuit

The switching circuit 90 of the power control circuit 50 automatically connects and disconnects the heating element 52 of the iron 10 to and from the AC power source based upon the proximity of a user's hand to the handle 18 of the iron 10 and the position of the iron 10.

Although other circuit designs are possible, the switching circuit 90 in the preferred embodiment includes OUTPUT pin 2 of the microcontroller 64 connected through a 1K ohm resistor R8 to the base of an npn transistor Q2. The emitter of transistor Q2 is connected to ground, and the collector of transistor Q2 is connected to the second terminal 63 of relay 62. A diode D5 is connected in parallel with relay 62 and functions to absorb inductive pulses from relay 62.

In operation, when 5 VDC is placed on OUTPUT pin 2 of the microcontroller 64, transistor Q2 turns on relay 62, which closes relay contact 94, thereby connecting the heating element 52 to the AC power source. Conversely, when no voltage is applied to OUTPUT pin 2, transistor Q2 turns off relay 62, which opens relay contact 92, thereby disconnecting the heating element 52 from the AC power source. In addition, the switching circuit 90 includes OUTPUT pin 3 of the microcontroller 64 connected through a 10K ohm resistor R9 to the anode of an LED 94, the cathode of which is connected to ground. When 5 VDC is placed on OUTPUT pin 3, LED 92 is turned on. Conversely, when no voltage is applied to OUTPUT pin 3, LED 92 is turned off.

Figure 6:
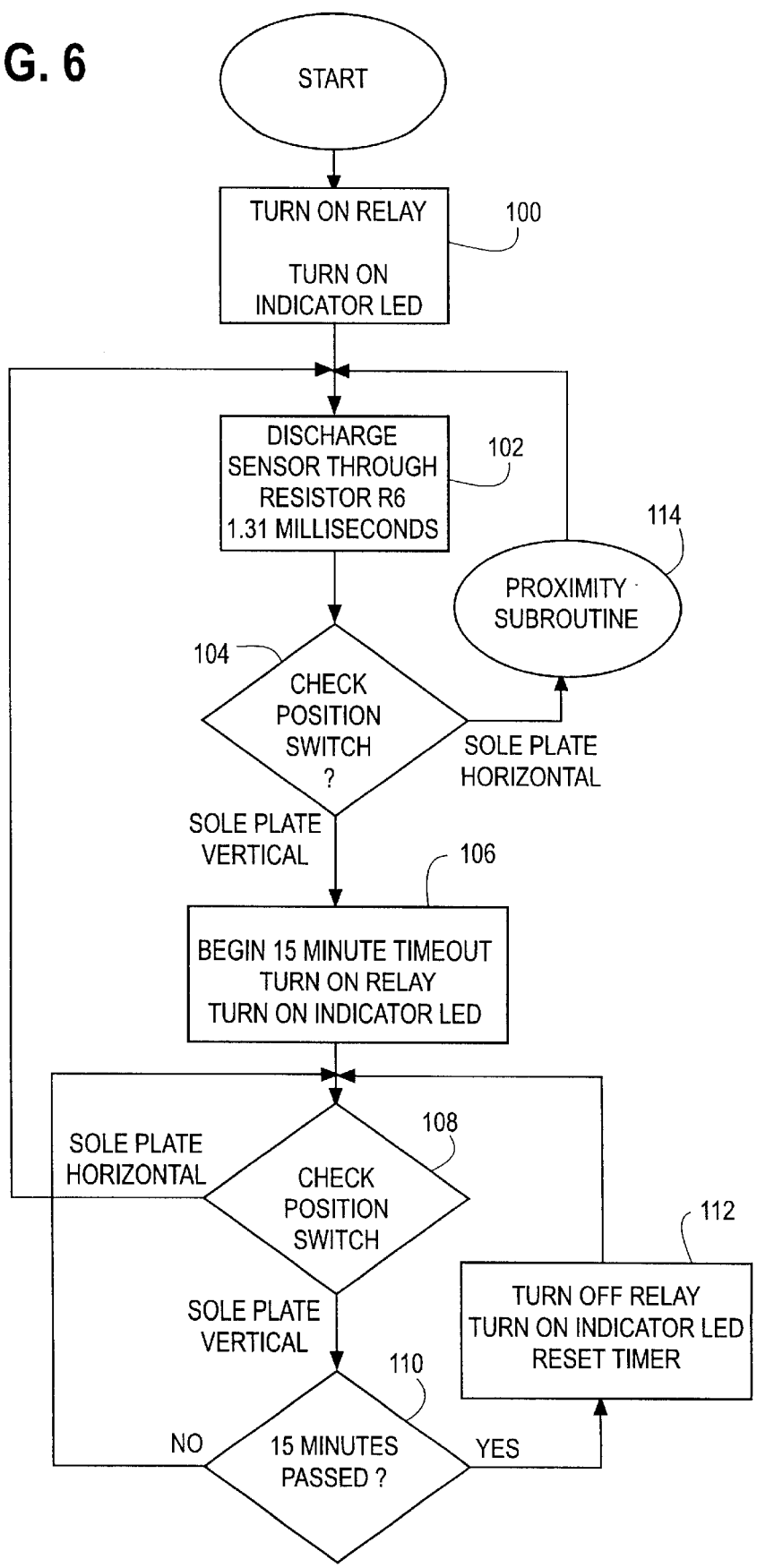
FIG. 6 is a logic flow diagram of the microcontroller of the power control circuit of FIG. 5.

Referring to FIGS. 6 and 7, the logic flow diagrams are shown of the computer instructions contained in the read-only memory of the microcontroller 64.

At block 100, the microcontroller 64 places 5 VDC on OUTPUT pin 2, which in turn energizes transistor Q2, turns on relay 62, closes relay contact 92, and connects the heating element 52 to the AC power source. At the same time, the microcontroller 64 places 5 VDC on OUTPUT pin 3, which in turn activates the LED 94.

At block 102, the microcontroller 64 applies no voltage to OUTPUT pin 7 for 131 milliseconds, thereby discharging the proximity sensor 72 through R6. At this point, the voltage of the proximity sensor 72 will be approximately 0 VDC.

At block 104, the microcontroller 64 senses the voltage level at INPUT pin 6. If the iron 10 is on its heel portion 16 in a substantially vertical position, 5 VDC is detected. If the iron 10 is on its soleplate 12 in a substantially horizontal position, no voltage is detected.

Iron Substantially Vertical

If the iron 10 is in a substantially vertical position, and 5 VDC is thereby detected at INPUT pin 6, at block 104, the microcontroller 64 again places 5 VDC on OUTPUT pin 2, which in turn energizes transistor Q2, turns on relay 62, closes relay contact 92, and connects the heating element 52 to the AC power source. At the same time, the microcontroller 64 places 5 VDC on OUTPUT pin 3, which in turn activates the LED 94. In addition, the microcontroller 64 sets an internal timer to fifteen minutes.

At block 108, the microcontroller 64 again senses the voltage level at INPUT pin 6 so as to determine the position of the iron 10. If the iron 10 is on its soleplate 12 in a substantially horizontal position, it returns to block 102.

If, however, the iron 10 is still on its heel portion 16 in a substantially vertical position, at block 110, the microcontroller 64 checks the internal timer to determine if fifteen minutes has passed. If fifteen minutes has not passed, the microcontroller 64 returns to block 108 and the internal timer continues to count. If ten minutes has passed, at block 112, the microcontroller 64 applies no voltage to OUTPUT pin 2, which in turn deenergizes transistor Q2, turns off relay 62, opens relay contact 94, and disconnects the heating element 52 from the AC power source. At the same time, the microcontroller 64 applies no voltage to OUTPUT pin 3, which in turn deactivates the LED 94. Also, the microcontroller resets the internal timer to fifteen minutes. The microcontroller 64 then returns to block 108. As such, the heating element 52 is automatically disconnected from the AC power source after the iron 10 has been in a substantially vertical position for fifteen minutes. Of course, any timeout period, such as ten minutes, may be used.

Iron Substantially Horizontal

Returning to block 104, if the iron 10 is in a substantially horizontal position, and no voltage is thereby detected at INPUT pin 6, the microcontroller 64 starts a proximity subroutine at block 114 to determine whether the user of the iron 10 is in proximity to the handle 18 of the iron 10. Referring to FIG. 7, at block 116, the microcontroller 64 places 5 VDC on OUTPUT pin 7 and charges the proximity sensor 72 through R6. At the same time, the voltage level of the signal is sensed at INPUT pin 5. As will become apparent, INPUT pin 5 in effect detects the proximity of a user to the handle 18 of the iron 10 by determining the capacitance of the proximity sensor 72.

At block 118, the microcontroller 64 determines the amount of time required to charge the proximity sensor 72 to a predetermined voltage level which, in the preferred embodiment, is 5 VDC. If the hand of a user is in proximity to the handle 18, the capacitance of the proximity sensor 72 will increase, and the amount of time required to charge the proximity sensor to 5 VDC will also increase. Conversely, if the hand of a user is not in proximity to the handle 18, the capacitance of the proximity sensor 72 will decrease, and the amount of time required to charge the proximity sensor to 5 VDC will also decrease.

Accordingly, at block 120, if the amount of time required to charge the proximity sensor 72 to 5 VDC is less than a predetermined setpoint, at block 122, the microcontroller 64 immediately applies no voltage to OUTPUT pin 2, which in turn deenergizes transistor Q2, turns off the relay 62, opens relay contact 92, disconnects the heating element 52 from the AC power source, and returns to block 102. As such, the heating element 52 is automatically disconnected from the AC power source if the iron 10 is left unattended in a substantially horizontal position. Of course, a time delay after detecting that the user is not in proximity to the handle 18 could also be used.

If the amount of time required to charge the proximity sensor 72 to 5 VDC is equal to a predetermined setpoint, at block 124, the microcontroller returns to block 102.

If the amount of time required to charge the proximity sensor 72 to 5 VDC is greater than a predetermined setpoint, at block 126, the micro controller 64 places 5 VDC on OUTPUT pin 2, which in turn energizes transistor Q2, turns on the relay 62, closes relay contact 92, connects the heating element 52 to the AC power source, and returns to block 102. As such, the heating element 52 is automatically connected to the AC power source if the iron 10 is in use in a substantially horizontal position.

In addition, it is apparent to one skilled in the art that the microcontroller 64 could also be programmed to determine the capacitance of the proximity sensor 72, and thus detect the proximity of a user to the handle 18 of the iron 10, by placing 5 VDC on OUTPUT pin 7 of the microcontroller 64 for a predetermined amount of time, and, at the end of the predetermined period of time, detecting the voltage level at INPUT pin 5. As such, the voltage level will be indirectly related to the capacitance of the proximity sensor 72.

It is to be understood that the present invention is not to be limited to the disclosed electric pressing iron, electrical circuits and logic flow diagrams. Rather, such are merely disclosed as a basis for teaching one skilled in the art to variously employ the present invention in many different types of electric appliances and with many different types of electrical circuits and logic flow diagrams, and as a basis for the claims.

What is claimed and desired to be secured by Letters Patent is as follows:

1. An electric iron, comprising:
    (a) a handle with an inner surface for allowing a user of said iron to grasp said iron;
    (b) a user proximity circuit for detecting whether said user is conformingly grasping said handle of said iron, said user proximity circuit comprising:
        (i) a proximity sensor comprising a pliable conductive sheet disposed within said handle of said iron, said conductive sheet being sufficiently pliable so as to substantially conform to said inner surface of said handle, wherein said pliable conductive sheet functions as a first plate of a capacitor and a hand of said user functions as a second plate of said capacitor such that an increase capacitance is created when said user is grasping said handle of said iron, and wherein said pliable conductive sheet is disposed to conform to said inner surface of said handle of said iron in such a manner that said user's hand does not directly contact said conductive sheet when said user is grasping said handle of said iron;
        (ii) a detection circuit coupled to said proximity sensor operative to detect said increased capacitance of said proximity sensor when said user is conformingly grasping said handle of said iron;
    (c) a switching circuit controlled by said user proximity circuit operative to automatically connect and disconnect said iron to and from a source of electrical power based upon whether said user is conformingly grasping said handle of said iron.

2. The electric iron of claim 1 wherein said pliable conductive sheet substantially conforms to a surface shape of said handle.

3. The electric iron of claim 2 wherein said detection circuit and said switching circuit are incorporated within a microcontroller.

4. The electric iron of claim 1 wherein said detection circuit and said switching circuit are incorporated within a microcontroller.

5. The electric iron according to claim 1, wherein said detection circuit charges said pliable conductive sheet, detects when said pliable conductive sheet disposed within said handle has reached a predetermined voltage level, determines the amount of time required to charge said pliable conductive sheet disposed within said handle to said predetermined voltage level, and compares said amount of time to predetermined setpoints, and whereby said amount of time is greater than said setpoints when said user is conformingly grasping said handle of said iron due to the effective capacitance created by said pliable conductive sheet conforming to the surface of said handle, said handle, and said user's hand.

6. The electric iron according to claim 1, further including an orientation circuit having an orientation sensor and a second detection circuit for detecting whether said iron is in an in-use position or a non-use position.

7. An electric iron having a handle with an inner surface and a circuit for detecting whether a user is conformingly grasping said handle and automatically connecting and disconnecting said iron to and from a source of electrical power based upon such detection, said circuit consisting essentially of:
(a) a proximity sensor comprising a pliable conductive sheet disposed within said handle of said iron, said conductive sheet being sufficiently pliable so as to substantially conform to said inner surface of said handle, wherein said conductive sheet functions as a first plate of a capacitor and a hand of said user functions as a second plate of said capacitor such that an increased capacitance is created when said user is conformingly grasping said handle of said iron, and wherein said pliable conductive sheet is disposed to conform with said inner surface of said handle of said iron in such a manner that said user's hand does not directly contact said conductive sheet when said user is conformingly grasping said handle of said iron; and
(b) a microcontroller coupled to said proximity sensor operative to:
  (i) detect whether said user is conformingly grasping said handle of said iron by detecting said increased capacitance of said proximity sensor;
  (ii) automatically connect and disconnect said iron to and from a source of electrical power based upon whether said user is conformingly grasping said handle of said iron.

8. The electric iron of claim 7 wherein said pliable conductive sheet substantially conforms to surface shape of said handle.

9. An electric iron, comprising:
(a) a handle with an inner surface for allowing a user of said iron to grasp said iron;
(b) a user proximity circuit for detecting whether said user is conformingly grasping said handle of said iron, said user proximity circuit comprising:
  (i) a proximity sensor comprising a pliable conductive sheet disposed within said handle of said iron, said conductive sheet being sufficiently pliable so as to substantially conform to said inner surface of said handle, wherein said pliable conductive sheet functions as a first plate of a capacitor and a hand of said user functions as a second plate of said capacitor such that an increased capacitance is created when said user is conformingly grasping said handle of said iron, and wherein said pliable conductive sheet functions as a first plate of a capacitor and a hand of said user functions as a second plate of said capacitor such that an increased capacitance is created when said user is grasping said handle of said iron, and wherein said pliable conductive sheet is disposed to conform with said inner surface of said handle of said iron in such a manner that said user's hand does not directly contact said conductive sheet when said user is grasping said handle of said iron;
  (ii) a detection circuit coupled to said proximity sensor operative to detect said increased capacitance of said proximity sensor when said user is conformingly grasping said handle of said iron;
(c) an orientation circuit having an orientation sensor and a second detection circuit for detecting whether said iron is in an in-use position or a non-use position; and
(d) a switching circuit controlled by said user proximity circuit and said orientation circuit operative to automatically connect and disconnect said iron to and from a source of electrical power based upon whether said user is conformingly grasping said handle of said iron and whether said iron is in said in-use position or said non-use position.

10. The electric iron of claim 9 wherein said pliable conductive sheet substantially conforms to a surface shape of said handle.

11. The electric iron of claim 10 wherein said detection circuit, said second detection circuit, and said switching circuit are incorporated within a microcontroller.

12. The electric iron of claim 9 wherein said detection circuit, said second detection circuit, and said switching circuit are incorporated within a microcontroller.

13. The electric iron according to claim 9, wherein said detection circuit charges said pliable conductive sheet, detects when said pliable conductive sheet disposed within said handle has reached a predetermined voltage level, determines the amount of time required to charge said pliable conductive sheet disposed within said handle to said predetermined voltage level, and compares said amount of time to predetermined setpoints, and whereby said amount of time is greater than said setpoints when said user is conformingly grasping said handle of said iron due to the effective capacitance created by said pliable conductive sheet conforming to the surface of said handle, said handle, and said user's hand.

14. An electric iron having a handle with an inner surface and a circuit for detecting whether a user is conformingly grasping said handle, detecting whether said iron is in an in-use position or non-use position, and automatically connecting and disconnecting said iron to and from a source of electrical power based thereon, said circuit consisting essentially of:
(a) a proximity sensor comprising a pliable conductive sheet disposed within said handle of said iron, said conductive sheet being sufficiently pliable so as to substantially conform to said inner surface of said handles wherein said pliable conductive sheet functions as a first plate of a capacitor and a hand of said user functions as a second plate of said capacitor such that an increased capacitance is created when said user is conforming grasping said handle of said iron, and wherein said pliable conductive sheet is disposed to conform with said inner surface of said handle of said iron in such a manner that said user's hand does not directly contact said pliable conductive sheet when said user is conformingly grasping said handle of said iron;
(b) an orientation sensor; and
(c) a microcontroller coupled to said proximity sensor and said orientation sensor operative to:
  (i) detect whether said user is conformingly grasping said handle of said iron by detecting said increased capacitance of said proximity sensor;
  (ii) detect whether said iron is in an in-use position or a non-use position;
  (iii) automatically connect and disconnect said iron to and from a source of electrical power based upon whether said user is conformingly grasping said handle of said iron and whether said iron is in said in-use position or said non-use position.

15. The electric iron of claim 14, wherein said pliable conductive sheet substantially conforms to a surface shape of said handle.

16. An electric iron, comprising:
    (a) a handle with an inner surface for allowing a user of said iron to grasp said iron;
    (b) a user proximity circuit for detecting whether said user is conformingly grasping said handle of said iron, said user proximity circuit comprising:
        (i) a proximity sensor comprising a pliable conductive sheet disposed within said handle of said iron, wherein said pliable conductive sheet functions as a first plate of a capacitor and a hand of said user functions as a second plate of said capacitor such that an increased capacitance is created when said user is conformingly grasping said handle of said iron, and wherein said conductive sheet is disposed to conform with said inner surface of said handle of said iron is such a manner that said user's hand does not directly contact said pliable conductive sheet when said user is conformingly grasping said handle of said iron;
        (ii) means for detecting said increased capacitance of said proximity sensor; and
    (c) means for automatically connecting and disconnecting said iron to and from a source of electrical power based upon whether said user is conformingly grasping said handle of said iron.

17. The electric iron of claim 16 wherein said pliable conductive sheet substantially conforms to a surface shape of said handle.

18. An electric iron, comprising:
    (a) a handle with an inner surface for allowing a user of said iron to grasp said iron;
    (b) a user proximity circuit for detecting whether said user is conformingly grasping said handle of said iron, said user proximity circuit comprising:
        (i) a proximity sensor comprising a pliable conductive sheet disposed within said handle of said iron, said conductive sheet being sufficiently pliable so as to substantially conform to said inner surface of said handle, wherein said pliable conductive sheet functions as a first plate of a capacitor and a hand of said user functions as a second plate of said capacitor such that an increased capacitance is created when said user is conformingly grasping said handle of said iron, and wherein said pliable conductive sheet is disposed to conform with said inner surface of said handle of said iron in such a manner that said user's hand does not directly contact said pliable conductive sheet when said user is grasping said handle of said iron;
        (ii) means for detecting said increased capacitance of said proximity sensor;
    (c) an orientation circuit having an orientation sensor and means for detecting whether said iron is in an in-use position or a non-use position; and
    (d) means for automatically connecting and disconnecting said iron to and from a source of electrical power based upon whether said user is conformingly grasping said handle of said iron and whether said iron is in said in-use position or said non-use position.

19. The electric iron of claim 18 wherein said pliable conductive sheet substantially conforms to a surface shape of said handle.

20. The electric iron according to claim 18, wherein said means for detecting said increased capacitance of said proximity sensor includes means for charging said pliable conductive sheet, means for detecting when said pliable conductive sheet disposed within said handle has reached a predetermined voltage level, means for determining the amount of time required to charge said pliable conductive sheet disposed within said handle to said predetermined voltage level, and means for comparing said amount of time to predetermined setpoints, and whereby said amount of time is greater than said setpoints when said user is conformingly grasping said handle of said iron due to the effective capacitance created by said pliable conductive sheet conforming to the surface of said handle, said handle, and said user's hand.

21. A method of detecting whether a user is conformingly grasping a handle of an electric iron, said handle having an inner surface, said method comprising the steps of:
    (a) charging a pliable conductive plate said conductive plate being sufficiently pliable so as to substantially conform to said inner surface of said handle, said plate disposed to conform with said inner surface of said handle;
    (b) detecting when said pliable conductive plate disposed within said handle has reached a predetermined voltage level;
    (c) determining the amount of time required to charge said pliable conductive plate disposed within said handle to said predetermined voltage level; and
    (d) comparing said amount of time to predetermined setpoints, wherein said amount of time is greater than said setpoints when said user is conformingly grasping said handle of said iron due to the effective capacitance created by said pliable conductive plate, said handle, and said user's hand.

22. The method of detecting whether a user is conformingly grasping a handle of an electric iron of claim 21 wherein said steps are performed by a microprocessor.

23. The method of detecting whether a user is conformingly grasping a handle of an electric iron of claim 22 wherein said predetermined setpoints are stored in a permanent memory of said microprocessor.

24. The method of detecting whether a user is conformingly grasping a handle of an electric iron of claim 21 wherein said pliable conductive sheet substantially conforms to a surface shape of said handle.

25. A method of controlling electrical power to an electric iron, comprising the steps of:
    (a) detecting whether a user is conformingly grasping a handle of said iron, said handle having an inner surface, by determining the effective capacitance of a pliable conductive sheets, said conductive sheet being sufficiently pliable so as to substantially conform to said inner surface of said handles, said conductive sheet disposed to conform with said inner surface of said handle of said iron;
    (b) detecting whether said iron is in an in-use position or non-use position; and
    (c) automatically connecting said iron to said source of electrical power when said user is conformingly grasping said handle of said iron and said iron is in an in-use position, automatically disconnecting said iron from said source of electrical power when said user is not grasping said handle of said iron and said iron is in an in-use position, and automatically disconnecting said iron from said source of electrical power after a predetermined amount of time when said iron is in a non-use position.

26. The method of controlling electrical power to an electric iron of claim 25 wherein said steps are performed by a microprocessor.

27. The method of controlling electrical power to an electric iron of claim 26 wherein said step of detecting whether a user is conformingly grasping said handle of said iron comprises the steps of:

(a) charging said pliable conductive sheet disposed to conform with said inner surface of said handle;

(b) detecting when said pliable conductive sheet disposed to conform with said inner surface of said handle has reached a predetermined voltage level;

(c) determining the amount of time required to charge said pliable conductive sheet disposed to conform with said inner surface of said handle to said predetermined voltage level; and (d) comparing said amount of time to predetermined setpoints, wherein said amount of time is greater than said setpoints when said user is conforminly grasping said handle of said iron due to the effective capacitance created by said pliable conductive sheet, said handle, and said user's hand.

28. The method of controlling electrical power to an electric iron of claim 27 wherein said predetermined setpoints are stored in a permanent memory of said microprocessor.

29. The method of controlling electrical power to an electric iron of claim 5 wherein said pliable conductive sheet substantially conforms to a surface shape of said handle.

* * * * *